United States Patent [19]

Hada et al.

[11] Patent Number: 6,087,063
[45] Date of Patent: Jul. 11, 2000

[54] POSITIVE-WORKING PHOTORESIST COMPOSITION

[75] Inventors: Hideo Hada, Hiratsuka; Kazufumi Sato, Sagamihara; Hiroshi Komano, Samukawa-machi, all of Japan

[73] Assignee: Tokyo Ohka Kogyo Co., Ltd., Japan

[21] Appl. No.: 09/102,622

[22] Filed: Jun. 23, 1998

[30] Foreign Application Priority Data

Jun. 27, 1997 [JP] Japan ..................... 9-171947

[51] Int. Cl.$^7$ ...................................... G03F 7/004
[52] U.S. Cl. ................. 430/270.1; 430/905; 430/910
[58] Field of Search ................. 430/270.1, 905, 430/910

[56] References Cited

FOREIGN PATENT DOCUMENTS

| 57-141644 | 9/1982 | Japan . |
|---|---|---|
| 4-39665 | 2/1992 | Japan . |
| 5-265212 | 10/1993 | Japan . |
| 5-346668 | 12/1993 | Japan . |
| 7-181677 | 7/1995 | Japan . |
| 09090637 | 4/1997 | Japan . |
| 9-90637 | 4/1997 | Japan . |

*Primary Examiner*—John S. Chu
*Attorney, Agent, or Firm*—Wenderoth, Lind & Ponack, L.L.P.

[57] ABSTRACT

Provided by the invention is a chemical-amplification positive-working photoresist composition used in the fine photolithographic patterning in the manufacturing process of semiconductor devices, which is suitable for the patterning light exposure with ArF excimer laser beams of very short wavelength by virtue of absence of aromatic structure in the ingredients of the composition. The composition comprises, as the film-forming resinous ingredient, an acrylic resin having unique monomeric units represented by the general formula

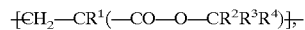

in which $R^1$ is a hydrogen atom or a methyl group, $R^2$ and $R^3$ are each, independently from the other, an alkyl group having 1 to 4 carbon atoms and $R^4$ is an alkoxycarbonyl group or a group derived from a molecule of a lactone compound or ketone compound by removing a hydrogen atom bonded to the carbon atom.

14 Claims, No Drawings

POSITIVE-WORKING PHOTORESIST COMPOSITION

BACKGROUND OF THE INVENTION

The present invention relates to a novel positive-working photoresist composition or, more particularly, to a positive-working photoresist composition of the chemical amplification type having high transparency to the ultraviolet light of the ArF excimer laser beam to exhibit high photosensitivity in pattern-wise exposure to light as well as high pattern resolution and suitable for puddle development with high affinity to an aqueous alkaline developer solution and capable of giving a patterned resist layer having an excellent cross sectional profile of the patterned resist layer which has good adhesion to the substrate surface and exhibits high resistance against dry etching.

As is known, positive-working photoresist compositions of the chemical amplification type form a class of the most promising photoresist compositions used in the modern photolithographic patterning technology in the manufacture of various kinds of fine electronic devices. The resinous ingredient most widely used in the prior art photoresist compositions of the chemical amplification type is, by virtue of the high transparency to the KrF excimer laser beams of 248 nm wavelength, a polyhydroxystyrene resin of which, optionally, a part of the hydroxyl groups are protected by substituting solubility-reducing groups capable of being dissociated in the presence of an acid.

As a trend in the current photolithographic patterning technology toward finer and finer patterning in the manufacture of semiconductor devices, the conventional KrF excimer laser beam of 248 nm wavelength as the light source for the pattern-wise exposure of the photoresist layer is now under continued replacement with the ArF excimer laser beam having a shorter wavelength of 193 nm.

The above mentioned polyhydroxystyrene-based resinous ingredient, however, is no longer quite satisfactory in the photolithographic patterning process using an ArF excimer laser as the patterning light source because the aromatic structure of the resin is not highly transparent to the light having a wavelength as short as 193 nm. In place of such an aromatic resin of low transparency to the short wavelength light, acrylic resin-based resinous ingredients free from aromatic structures are now highlighted in the photolithographic technology despite the defects thereof that acrylic resins in general are not highly resistant against dry etching which is a step usually involved in the manufacture of semiconductor devices.

As an improvement of acrylic resins in respect of the transparency and dry etching resistance, a proposal is made in Japanese Patent Kokai 4-39665 for a polymer of an acrylate ester having a skeletal structure of adamantane in the ester-forming part of the molecule. Japanese Patent Kokai 5-265212 proposes a copolymer of tetrahydropyranyl acrylate and an acrylate ester having a skeletal structure of adamantane in the ester-forming part of the molecule. A problem in these prior art resins is that the monomers used in the preparation of the resins are very expensive due to introduction of the very specific adamantane structure into the acrylate ester molecules even if it be set aside that a high photosensitivity as desired cannot be obtained with the photoresist composition and the cross sectional profile of the patterned resist layer formed therefrom is not quite satisfactory. Accordingly, the resinous material having an adamantane structure is not suitable for industrial applications to photoresist compositions.

While the photolithographic process using the ArF laser beams has been developed with an important object to obtain a patterned resist layer having fineness of 0.2 μm or even finer with good resolution, a problem to be solved in the use of a conventional acrylic resin as an ingredient in the photoresist composition is that the adhesion between the substrate surface and the resist layer is not high enough sometimes to cause a trouble due to falling of the patterned resist layer.

In view of the above mentioned problems, proposals are made for an acrylic resin of which a part of the monomeric units are derived from an acrylate ester having an oxygen-containing heterocyclic group such as 3-oxocyclohexyl ester group taught in Japanese Patent Kokai 5-346668 and γ-butyrolactone group taught in Japanese Patent Kokai 7-181677.

Though not without improvements in respect of the adhesion to the substrate surface, the above mentioned specific acrylate ester compounds are not suitable for mass production due to the complicated and lengthy synthetic procedure thereof. In addition, due to the relatively low affinity of the resin to an aqueous alkaline developer solution, the puddle development as a major current in the modern photolithographic process cannot be undertaken for the development treatment of the photoresist layer. Accordingly, it is eagerly desired in the photolithographic fine patterning technology to develop a novel and improved photoresist composition suitable for patterning light exposure with ArF excimer laser beams and exhibiting high adhesion of the resist layer to the substrate surface along with good affinity to an aqueous alkaline developer solution to give applicability of the puddle development treatment.

Besides, Japanese Patent Kokai 9-90637 discloses an acrylic resin having monomeric units derived from an acrylate ester which is formed from acrylic acid and a lactone bonded at the β-position, as in mevalonic lactone, with introduction of an alkyl group to the β-carbon atom. The lactone residue, having an alkyl group bonded to the β-carbon atom, is dissociable by interacting with the acid generated from an acid generating agent. The photoresist composition disclosed there is not satisfactory in respect of the photosensitivity and pattern resolution with poor contrast between the pattern-wise exposed areas and the unexposed areas.

SUMMARY OF THE INVENTION

In view of the above described problems in the prior art, the present invention has an object to provide an improved positive-working photoresist composition of the chemical amplification type having high transparency to the ArF excimer laser beams to exhibit high photosensitivity and high pattern resolution and having high affinity to an aqueous alkaline developer solution giving applicability of the puddle development process to give a patterned resist layer having good adhesion to the substrate surface, excellent cross sectional profile of the patterned resist layer and high resistance against dry etching.

Thus, the positive-working photoresist composition provided by the present invention is a uniform solution in an organic solvent which comprises:

(A) 100 parts by weight of an acrylic resin which is subject to a change in the solubility in an aqueous alkaline solution in the presence of an acid; and (B) from 0.5 to 30 parts by weight of an acid-generating compound capable of releasing an acid when irradiated with actinic rays, the acrylic resin as the component (A) comprising monomeric units represented by the general formula

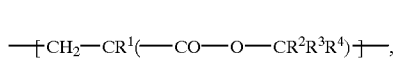  (I)

in which $R^1$ is a hydrogen atom or a methyl group, $R^2$ and $R^3$ are each, independently from the other, an alkyl group having 1 to 4 carbon atoms and $R^4$ is an alkoxycarbonyl group or a group derived from a molecule of a lactone compound or ketone compound by removing a hydrogen atom bonded to the carbon atom, and the molar fraction of the monomeric units of the general formula (I) being in the range from 20% to 80% in the acrylic resin.

DETAILED DESCRIPTION OF THE PREFERRED EMBODIMENTS

As is understood from the above given description, the most characteristic feature of the inventive positive-working photoresist composition is in the use of a very unique and specific acrylic or methacrylic resin as the component (A), which comprises the monomeric units represented by the general formula (I) given above and is subject to an increase of the solubility in an aqueous alkaline solution by reacting with an acid.

The above mentioned specific monomeric unit represented by the general formula (I) is derived from a (meth)acrylic acid ester represented by the general formula

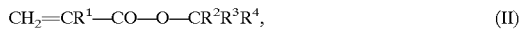  (II)

in which each symbol has the same meaning as defined above. This monomeric compound can be synthesized easily and inexpensively by the esterification reaction of acrylic or methacrylic acid with an alcoholic compound of the general formula

  (III)

in which each symbol again has the same meaning as defined above.

In the above given general formulas, $R^2$ and $R^3$ are each, independently from the other, a straightly linear or branched alkyl group having 1 to 4 carbon atoms including methyl, ethyl, n-propyl, isopropyl, n-butyl, isobutyl, sec-butyl and tert-butyl groups. It is preferable that $R^2$ and $R^3$ are each a methyl group in respect of the good availability of the compound. Needless to say and by definition, either one or both of $R^2$ and $R^3$ cannot be a hydrogen atom because, when either one or both of the groups $R^2$ and $R^3$ are hydrogen atoms, the ester group is no longer dissociable in the presence of an acid.

The group denoted by $R^4$ in the general formulas is an alkoxycarbonyl group having 1 to 4 carbon atoms or a residue derived from the molecule of a lactone compound or ketone compound by removing one hydrogen atom therefrom. When $R^4$ is a residue derived from a lactone compound, $R^4$ is preferably a residue derived from γ-butyrolactone, γ- or δ-valerolactone or a derivative compound thereof. The derivative of a lactone compound above mentioned is exemplified by those substituted by a lower alkyl group, e.g., methyl and ethyl groups, or a lower alkoxy group, e.g., methoxy and ethoxy groups, as well as those having two or more oxygen atoms within a lactone ring and those having a methoxy carbonyl or acyl groups substituting the lactone ring. Preferably, the group denoted by $R^4$ is a γ-butyrolactone residue per se or a γ-butyrolactone residue substituted by a lower alkyl or alkoxy group.

Examples of the alcoholic compound represented by the general formula (III), from which the (meth)acrylate ester monomer of the general formula (II) is prepared, include those expressed by the following structural formulas

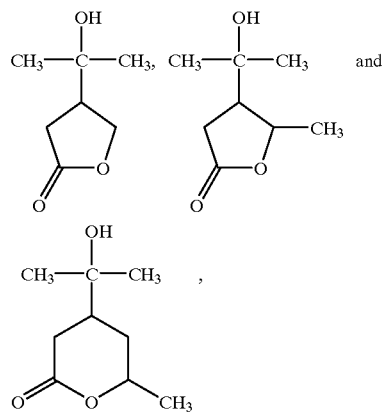

of which those having a 5-membered lactone ring are preferable.

When the group denoted by $R^4$ is a residue derived from a ketone compound, the ketone compound should preferably have 2 to 10 carbon atoms in a molecule. A preferable group of this class as $R^4$ is an acetonyl group, i.e. acetyl methyl group. In particular, the most preferable of the alcoholic compounds of the general formula (III) of this class is that of which $R^2$ and $R^3$ are each a methyl group and $R^4$ is an acetonyl group or, namely, 4-hydroxy-4-methyl-2-pentanone, i.e. diacetone alcohol, expressed by the structural formula

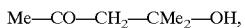

in which Me is a methyl group.

Examples of the alkoxycarbonyl group denoted by $R^4$ include lower alkoxycarbonyl groups, preferably, having 1 to 4 carbon atoms such as methoxycarbonyl, ethoxycarbonyl, propoxycarbonyl and butoxycarbonyl groups.

Examples of preferable alcoholic compound, from which the (meth)acrylate ester monomer of the general formula (II) is obtained, include lower alkyl esters of 2-hydroxy-2-methyl propionic acid of the general formula R—O—CO—CMe$_2$—OH, in which R is a lower alkyl group having 1 to 4 carbon atoms.

The molar fraction of the monomeric units represented by the general formula (I) in the acrylic resin as the component (A) of the inventive photoresist composition is in the range from 20% to 80% or, preferably, from 40% to 70% in respect of the good balance of the desirable properties such as the photosensitivity, pattern resolution, transparency and adhesion of the resist layer to the substrate surface as well as the affinity to an aqueous alkaline solution although a homopolymeric acrylic resin consisting of the monomeric units of the general formula (I) alone can also be used.

Accordingly, the acrylic resin as the component (A) in the inventive photoresist composition can be prepared by the copolymerization reaction of a monomer mixture containing from 20% to 80% by moles or, preferably, from 40% to 70% by moles of the (meth)acrylate ester compound of the general formula (II), which is referred to as the comonomer (a1) hereinafter, the balance in the monomer mixture being one or more of other monomers copolymerizable with the comonomer (a1) described below.

The monomers to be copolymerized with the above mentioned comonomer (a1) can be selected from several classes of ethylenically unsaturated polymerizable compounds including (a2) derivatives of (meth)acrylic acid substituted by an acid-dissociable group or a group imparting the polymer with improved resistance against dry etching conventionally used in the preparation of a resinous ingredient in the prior art positive-working photoresist compositions of the chemical amplification type, (a3) ethylenically unsaturated carboxylic acids such as (meth)acrylic acid, maleic acid, fumaric acid and the like which impart the resin with an increased solubility in an aqueous alkaline solution, (a4) other monomeric compounds known in conventional acrylic resins such as acrylonitrile and 2-hydroxyethyl acrylate, and (a5) other acrylic monomers having, in the molecule, an oxygen-containing heterocyclic ring structure. These comonomers (a2) to (a5) can be copolymerized with the comonomer (a1) either singly or as a combination of two kinds or more according to need.

Examples of the comonomer (a2) include (meth)acrylate ester compounds derived from (meth)acrylic acid by substituting an acid-dissociable group for the hydroxyl group of the carboxyl group such as tert-butyl (meth)acrylate, tetrahydropyranyl (meth)acrylate, tetrahydrofuranyl (meth)acrylate, 1-methylcyclohexyl (meth)acrylate, 1-methyladamantyl (meth)acrylate, ethoxyethyl (meth)acrylate, methoxypropyl (meth)acrylate, ester of (meth)acrylic acid with 2-hydroxy-3-pinanone and the like as well as those (meth)acrylate esters derived from (meth)acrylic acid by substituting an acid-undissociable group for the hydroxyl group of the carboxyl group such as adamantyl (meth)acrylate, cyclohexyl (meth)acrylate, naphthyl (meth)acrylate, benzyl (meth)acrylate, 3-oxocyclohexyl (meth)acrylate, bicyclo[2.2.1]heptyl (meth)acrylate, tricyclodecanyl (meth)acrylate, ester of (meth)acrylic acid with terpineol, ester of (meth)acrylic acid with 3-bromoacetone and the like.

The comonomer (a2) can be represented by the general formula $$CH_2=CR^1-CO-O-Y,\qquad(IV)$$

in which $R^1$ is a hydrogen atom or a methyl group and Y is a group selected from the group consisting of tert-butyl group, ethoxyethyl group, methoxypropyl group, terpineol residue and those groups expressed by the formulas

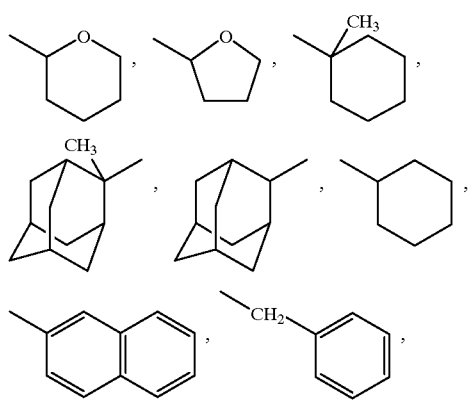

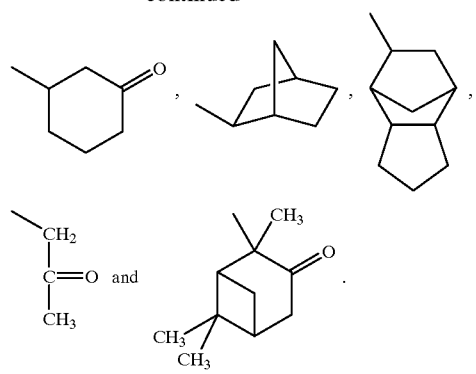

The comonomer (a3) is exemplified by (meth)acrylic acid, maleic acid and fumaric acid, of which (meth)acrylic acid is preferable.

Examples of the comonomer (a4) include alkyl (meth)acrylates such as methyl (meth)acrylate, ethyl (meth)acrylate, propyl (meth)acrylate, isopropyl (meth)acrylate, n-butyl (meth)acrylate, isobutyl (meth)acrylate, n-hexyl (meth)acrylate, octyl (meth)acrylate, 2-ethylhexyl (meth)acrylate, lauryl (meth)acrylate, 2-hydroxyethyl (meth)acrylate, 2-hydroxypropyl (meth)acrylate and the like, unsaturated amide compounds such as (meth)acrylamide, N-methylol (meth)acrylamide and diacetone acrylamide and other ethylenically unsaturated monomeric compounds such as (meth)acrylonitrile, vinyl chloride, ethyl vinyl ether and the like.

The comonomer (a5) is a (meth)acrylate ester compound represented by the general formula

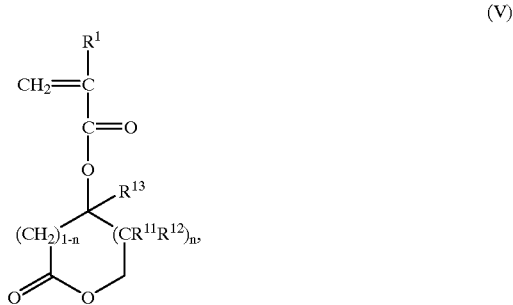

(V)

in which $R^1$ is a hydrogen atom or a methyl group, $R^{11}$, $R^{12}$ and $R^{13}$ are each, independently from the others, a hydrogen atom, alkyl group having 1 to 4 carbon atoms or alkoxy group having 1 to 4 carbon atoms and the subscript n is 0 or 1. The alcoholic compound from which the ester compound of the above given general formula (V) is formed with (meth)acrylic acid is exemplified by those expressed by the structural formulas

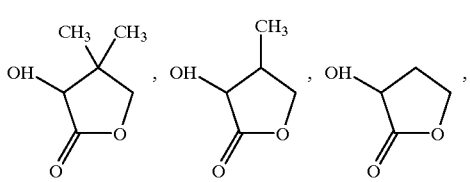

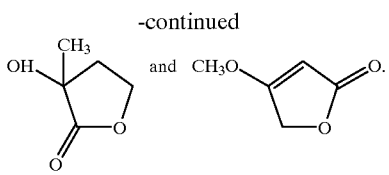

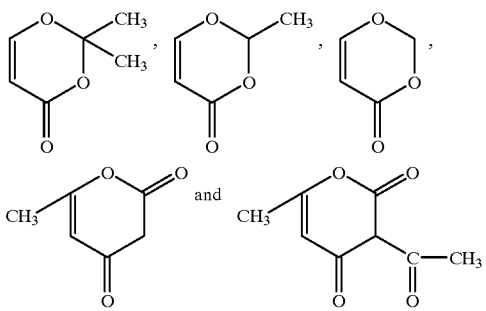

When the comonomer (a5) is used in the preparation of the acrylic resin as the component (A), the comonomer (a5) is preferably one of those of the general formula (V) of which the subscript n is 1 and $R^{11}$ and $R^{12}$ are each a methyl group or those of which the subscript n is 1 and $R^{13}$ is a methyl group in respect of the high affinity to an aqueous alkaline solution imparted to the component (A) which is a desirable condition for the applicability of the puddle development treatment.

Alternatively, the comonomer (a5) can be selected from those (meth)acrylate ester compounds represented by the general formula

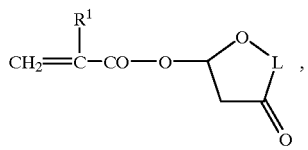
(VI)

in which $R^1$ is a hydrogen atom or a methyl group and L is an unsubstituted or alkyl-substituted methylene group. The ethylenically unsaturated compound from which the alcoholic part of the ester compound of the above given general formula (VI) is derived by esterification with (meth)acrylic acid is exemplified by those expressed by the structural formulas

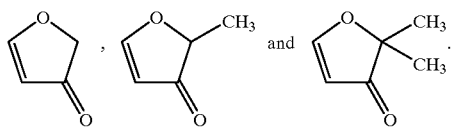

Further alternatively, the comonomer (a5) can be selected from those (meth)acrylate ester compounds represented by the general formula

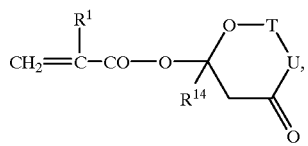
(VII)

in which $R^1$ is a hydrogen atom or a methyl group, $R^{14}$ is a hydrogen atom or a methyl group, U is an oxygen atom or an unsubstituted or acyl-substituted methylene group and T is an unsubstituted or alkyl-substituted methylene group or a carbonyl group. The ethylenically unsaturated compound, from which the alcoholic part of the ester compound of the above given general formula (VII) is derived by esterification with (meth)acrylic acid, is exemplified by those expressed by the structural formulas The acrylic resin as the component (A) in the inventive photoresist composition is preferably a copolymer consisting of the monomeric units derived from the comonomer (a1) and the monomeric units derived from one or more of the comonomers (a2) to (a5) described above. In particular, it is more preferable that the acrylic resin consists of the monomeric units derived from the comonomer (a1) and the monomeric units derived from the comonomers (a2) and/or (a5). Most preferably, the acrylic resin is a copolymer obtained by copolymerizing a (meth)acrylate ester compound represented by the general formula (V) or a (meth) acrylic acid ester of 2-hydroxy-3-pinanone with the comonomer (a1).

It is preferable that the copolymeric acrylic resin as the component (A) consists of from 20% to 80% by moles or, more preferably, from 40% to 70% by moles of the monomeric units derived from the comonomer (a1), the balance being the monomeric units derived from the comonomers (a2) and/or (a5) in respect of obtaining high resistance against dry etching, adhesion to the substrate surface and contrast between the pattern-wise exposed areas and the unexposed areas in the patterned resist layer.

The component (B) in the inventive photoresist composition is a radiation-sensitive acid generating agent which is a compound capable of releasing an acid by decomposition when irradiated with actinic rays such as ultraviolet light. The acid-generating agent used in the inventive photoresist composition is not particularly limited to a specific compound but can be selected from those radiation-sensitive acid-generating compounds used in conventional photoresist compositions of the chemical amplification type.

For example, the acid-generating compound can be selected from the compounds belonging to the following classes (i) to (vii) though not particularly limitative thereto:

(i) bissulfonyl diazomethane compounds such as bis(p-toluenesulfonyl) diazomethane, bis(1,1-dimethylethylsulfonyl) diazomethane, bis (cyclohexylsulfonyl) diazomethane and bis(2,4-dimethylphenylsulfonyl) diazomethane;

(ii) nitrobenzyl compounds such as 2-nitrobenzyl p-toluenesulfonate and 2,6-dinitrobenzyl p-toluenesulfonate;

(iii) sulfonic acid esters such as pyrogallol trimesylate and pyrogallol tritosylate;

(iv) onium salt compounds such as diphenyliodonium hexafluorophosphate, (4-methoxyphenyl) phenyliodonium trifluoromethane sulfonate, bis(p-tert-butylphenyl)iodonium trifluoromethane sulfonate, triphenylsulfonium hexafluorophosphate, (4-methoxyphenyl)diphenylsulfonium trifluoromethane sulfonate, (p-tert-butylphenyl) diphenylsulfonium trifluoromethane sulfonate and triphenylsulfonium trifluoromethane sulfonate;

(v) alkyl-substituted or unsubstituted benzoin tosylate compounds such as benzoin tosylate and α-methylbenzoin tosylate;

(vi) halogen-containing triazine compounds such as 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis-(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, 2,4,6-tris(dibromopropyl)-1,3,5-triazine, tris(2,3-dibromopropyl)-1,3,5-triazine and tris(2,3-dibromopropyl) isocyanurate; and (vii) cyano group-containing oximesulfonate compounds such as α-(methylsulfonyloxyimino)phenyl acetonitrile, α-(methylsulfonyloxyimino)-4-methoxyphenyl acetonitrile, α-(trifluoromethylsulfonyloxyimino)phenyl acetonitrile, α-(trifluoromethylsulfonyloxyimino)-4-methoxyphenyl acetonitrile, α-(ethylsulfonyloxyimino)-4-methoxyphenyl acetonitrile, α-(propylsulfonyloxyimino)-4-methylphenyl acetonitrile, α-(methylsulfonyloxyimino)-4-bromophenyl acetonitrile, α-(methylsulfonyloxyimino)-1-cyclopentenyl acetonitrile, α-(1- or 2-naphthylsulfonyloxyimino)-4-methoxybenzyl cyanide, α-(10-camphorsulfonyloxyimino)-4-methoxybenzyl cyanide, α-(p-toluenesulfonyloxyimino)phenyl acetonitrile and α-(phenylsulfonyloxyimino)-p-methoxyphenyl acetonitrile; of which the onium salt compounds and the cyano group-containing oximesulfonate compounds are particularly preferable.

Among the above named compounds, particularly preferable are the onium salt compounds and the oximesulfonate compounds having a cyano group in the molecule. The amount of the component (B) in the inventive photoresist composition is in the range from 0.5 to 30 parts by weight or, preferably, from 1 to 10 parts by weight per 100 parts by weight of the component (A). When the amount of the component (B) is too small, no good patterning can be accomplished in the photoresist layer formed from the composition while, when the amount of the component (B) is too large, the composition is sometimes not a uniform solution due to limited solubility of the component (B) or, even if a uniform solution can be obtained, the storage stability of the solution cannot be high enough.

It is of course optional that the inventive photoresist composition can be admixed according to need, besides the above described essential components (A) and (B), with various kinds of known additives conventionally used in photoresist compositions including halation inhibitors, antioxidants, heat stabilizers, adhesion improvers, plasticizers, coloring agents, surface active agents, auxiliary resins, carboxylic acids, amine compounds and the like each in a limited amount.

The positive-working photoresist composition of the invention is used usually in the form of a uniform solution prepared by dissolving the above described essential and optional ingredients in a suitable organic solvent. Examples of suitable organic solvents include ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane, and ester solvents such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need.

A typical procedure for the photolithographic patterning by using the inventive photoresist composition is as follows though with a possibility of modification. Thus, a substrate material such as a semiconductor silicon wafer is uniformly coated with the photoresist composition in the form of a solution followed by pre-baking at a temperature of 70 to 150° C. for 30 to 150 seconds to form a photoresist layer which is pattern-wise exposed to actinic rays such as ArF excimer laser beams to form a latent image of the pattern. Thereafter, the photoresist layer is, after a post-exposure baking treatment at a temperature of 70 to 150° C. for 30 to 150 seconds, subjected to a development treatment with an aqueous alkaline solution so as to dissolve away the resist layer in the exposed areas leaving a patterned resist layer in the unexposed areas. The developer solution is preferably an aqueous solution of tetramethylammonium hydroxide.

Advantageously, the positive-working photoresist composition of the present invention has high transparency to the ArF excimer laser beams so that a patterned resist layer of high pattern resolution can be obtained with a high photosensitivity. Further, the composition has good affinity to the aqueous alkaline developer solution and the patterned resist layer has an excellently orthogonal cross sectional profile as well as good adhesion to the substrate surface and high resistance against dry etching.

In the following, the positive-working photoresist composition of the present invention is described in more detail by way of Examples, in which the term of "parts" always refers to "parts by weight", as preceded by a description of the procedures for the preparation of the copolymeric resins used as the component (A) as well as the monomeric compounds used therein.

Preparation 1.

A monomeric compound used in the preparation of a copolymeric resin as the component (A), referred to as the monomer I hereinafter, was prepared in the following manner. Thus, 69.6 g (0.6 mole) of diacetone alcohol and 60 g (0.6 mole) of triethylamine were dissolved in 200 ml of methylene chloride under agitation to form a solution to which 62.4 g (0.6 mole) of methacryloyl chloride were added dropwise at 0° C. over a period of 1 hour.

Thereafter, the temperature of the reaction mixture was increased to 25° C. and the mixture was kept at this temperature for 24 hours to effect the reaction followed by filtration. The filtrate obtained by filtration was distilled to remove the solvent and the residue was dissolved in 300 ml of diethyl ether to give a solution which was washed 10 times repeatedly with a 10% aqueous solution of sodium hydroxide followed by evaporation of the diethyl ether and distillation of the remaining liquid at a temperature of 70 to 75° C. under a reduced pressure of 1 mmHg to give 80 g of a colorless liquid product having a boiling point of 70 to 75° C. under a pressure of 11 mmHg as a methacrylic acid ester of diacetone alcohol. The yield of the product was 80% of the theoretical value.

The ¹H-NMR spectrum (solvent: CDCl₃) of the above obtained compound had peaks at the δ values of 1.25, 1.55, 1.89, 2.19, 2.65, 3.12, 5.52 and 6.05 ppm.

Further, the infrared absorption spectrum of the compound had an absorption band at 1368 cm$^{-1}$ assignable to the ester linkage and an absorption band at 1713 cm$^{-1}$ assignable to the carbonyl groups.

The monomeric compound prepared in this Preparation is a compound expressed by the general formula (II) given before, in which $R^1$, $R^2$ and $R^3$ are each a methyl group and $R^4$ is an acetonyl group.

Preparation 2.

A copolymeric resin, referred to as the copolymer A1 hereinafter, was prepared in the following manner. Thus, a 50:50 by moles monomeric mixture was prepared by dissolving 23 g (0.125 mole) of the monomer I prepared in Preparation 1 described above and 24.8 g (0.125 mole) of a methacrylic acid ester having a γ-lactone ring, referred to as the comonomer A hereinafter, expressed by the structural formula

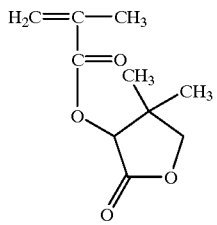

in 150 g of dioxane together with 1.62 g of azobisisobutyronitrile as the polymerization initiator and the mixture was heated at 75° C. for 3 hours to effect the copolymerization reaction. After completion of the reaction, the reaction mixture was poured into 5 liters of n-heptane to precipitate the copolymeric resin which was collected by filtration and dried at room temperature under reduced pressure to give 40 g of the dried resin, i.e. copolymer A1.

The copolymer A1 had a weight-average molecular weight of 16200 and the dispersion of the molecular weight, i.e. ratio of the weight-average molecular weight to the number-average molecular weight, was 2.13.

Preparation 3.

A copolymeric resin, referred to as the copolymer A2 hereinafter, was prepared in the following manner. Thus, a 50:50 by moles monomeric mixture was prepared by dissolving 11.5 g (0.0625 mole) of the monomer I prepared in Preparation 1 described above and 14.6 g (0.0625 mole) of a methacrylic acid ester compound, referred to as the comonomer B hereinafter, expressed by the structural formula

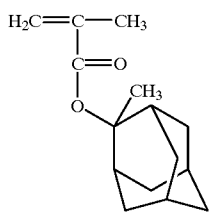

in 150 g of dioxane together with 0.82 g of azobisisobutyronitrile as the polymerization initiator and the mixture was heated at 75° C. for 3 hours to effect the copolymerization reaction. After completion of the reaction, the reaction mixture was poured into 5 liters of methyl alcohol to precipitate the copolymeric resin which was collected by filtration and dried at room temperature under reduced pressure to give 20.0 g of the dried resin, i.e. copolymer A2.

The copolymer A2 had a weight-average molecular weight of 18200 and the dispersion of the molecular weight was 2.01.

Preparation 4.

A monomeric compound used in the preparation of a copolymeric resin as the component (A), referred to as the monomer II hereinafter, was prepared in the following manner. Thus, 94.8 g (0.6 mole) of an alcohol compound expressed by the structural formula

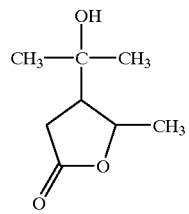

and 60 g (0.6 mole) of triethylamine were dissolved in 200 ml of tetrahydrofuran under agitation to form a solution to which 62.4 g (0.6 mole) of methacryloyl chloride were added dropwise at 0° C. over a period of 1 hour.

Thereafter, the temperature of the reaction mixture was increased to 25° C. and the mixture was kept at this temperature for 24 hours to effect the reaction followed by filtration. The filtrate obtained by filtration was distilled to remove the solvent and the residue was dissolved in 300 ml of diethyl ether to give a solution which was washed 10 times repeatedly with a 10% aqueous solution of sodium hydroxide. The solution was subjected to column chromatographic purification by using n-heptane as the eluant to give 67 g of a colorless liquid product as a methacrylic acid ester of the above mentioned starting alcohol compound, i.e. monomer II. The yield of this product was 50% of the theoretical value.

The ¹H-NMR spectrum (solvent: acetone-d₆) of the above obtained compound had peaks at the δ values of 0.99, 1.19, 1.4–2.7, 2.80, 4.55, 5.50 and 6.00 ppm.

Further, the infrared absorption spectrum of the compound had absorption bands at 1755 cm$^{-1}$ and 1777 cm$^{-1}$ assignable to the carbonyl groups.

The monomeric compound prepared in this Preparation is a compound expressed by the general formula (II) given before, in which $R^1$, $R^2$ and $R^3$ are each a methyl group and $R^4$ is a group expressed by the formula

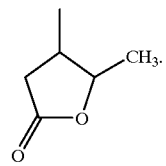

Preparation 5.

A copolymeric resin, referred to as the copolymer A3 hereinafter, was prepared in the following manner. Thus, a 50:50 by moles monomeric mixture was prepared by dissolving 15.1 g (0.0625 mole) of the monomer II prepared in Preparation 4 described above and 11.5 g (0.0625 mole) of the comonomer A used in Preparation 2 in 150 g of tetrahydrofuran together with 0.82 g of azobisisobutyronitrile as the polymerization initiator and the mixture was heated at 75° C.

for 3 hours to effect the copolymerization reaction. After completion of the reaction, the reaction mixture was poured into 5 liters of n-heptane to precipitate the copolymeric resin which was collected by filtration and dried at room temperature under reduced pressure to give 21.0 g of the dried resin, i.e. copolymer A3.

The copolymer A3 had a weight-average molecular weight of 17400 and the dispersion of the molecular weight was 2.30.

Preparation 6.

A copolymeric resin, referred to as the copolymer A4 hereinafter, was prepared in the following manner. Thus, a 50:50 by moles monomeric mixture was prepared by dissolving 15.1 g (0.0625 mole) of the monomer II prepared in Preparation 4 described above and 14.6 g (0.0625 mole) of the comonomer B used in Preparation 3 in 150 g of tetrahydrofuran together with 0.82 g of azobisisobutyronitrile as the polymerization initiator and the mixture was heated at 75° C. for 3 hours to effect the copolymerization reaction. After completion of the reaction, the reaction mixture was poured into 5 liters of n-heptane to precipitate the copolymeric resin which was collected by filtration and dried at room temperature under reduced pressure to give 22.0 g of the dried resin, i.e. copolymer A4.

The copolymer A4 had a weight-average molecular weight of 14600 and the dispersion of the molecular weight was 2.00.

Preparation 7.

A copolymeric resin, referred to as the copolymer A5 hereinafter, was prepared in the following manner. Thus, a 50:50 by moles monomeric mixture was prepared by dissolving 17.2 g (0.094 mole) of a methacrylic acid ester expressed by the structural formula

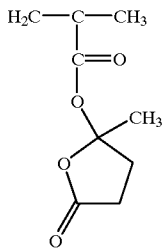

and 16.1 g (0.094 mole) of tetrahydropyranyl methacrylate in 150 g of tetrahydrofuran together with 0.82 g of azobisisobutyronitrile as the polymerization initiator and the mixture was heated at 75° C. for 3 hours to effect the copolymerization reaction. After completion of the reaction, the reaction mixture was poured into 5 liters of n-heptane to precipitate the copolymeric resin which was collected by filtration and dried at room temperature under reduced pressure to give 15.0 g of the dried resin, i.e. copolymer A5.

The copolymer A5 had a weight-average molecular weight of 14000 and the dispersion of the molecular weight was 1.90.

Preparation 8.

A copolymeric resin, referred to as the copolymer A6 hereinafter, was prepared in the same manner as in Preparation 3 excepting for the replacement of 11.5 g (0.0625 mole) of the monomer I with 11.5 g (0.0625 mole) of the comonomer A used in Preparation 2 to give 23.0 g of a dried resin, i.e. copolymer A6.

The copolymer A6 had a weight-average molecular weight of 18000 and the dispersion of the molecular weight was 2.3.

Preparation 9.

A copolymeric resin, referred to as the copolymer A7 hereinafter, was prepared in the same manner as in Preparation 2 excepting for the replacement of 24.8 g (0.125 mole) of the comonomer A with 29.5 g (0.125 mole) of a methacrylic acid ester of 2-hydroxy-3-pinanone to give 21.0 g of a dried resin, i.e. copolymer A7, as a copolymer of the monomer I and the methacrylic acid ester of 2-hydroxy-3-pinanone.

The copolymer A7 had a weight-average molecular weight of 10100 and the dispersion of the molecular weight was 2.5.

Preparation 10.

A copolymeric resin, referred to as the copolymer A8 hereinafter, was prepared in the same manner as in Preparation 5 excepting for the replacement of 11.5 g (0.0625 mole) of the comonomer A with 14.8 g (0.0625 mole) of the methacrylic acid ester of 2-hydroxy-3-pinanone and replacement of 150 g of tetrahydrofuran with 100 g of dioxane to give 16.3 g of a dried resin, i.e. copolymer A8, as a copolymer of the monomer II and the methacrylic acid ester of 2-hydroxy-3-pinanone.

The copolymer A8 had a weight-average molecular weight of 9200 and the dispersion of the molecular weight was 2.6.

EXAMPLE 1

A positive-working photoresist composition in the form of a solution was prepared by dissolving 100 parts of the copolymer A1 obtained in Preparation 2 and 2 parts of bis(p-tert-butylphenyl) iodonium trifluoromethane sulfonate in 680 parts of propyleneglycol monomethyl ether acetate.

A semiconductor silicon wafer was uniformly coated with this photoresist solution on a spinner followed by drying of the photoresist solution on a hot plate at 100° C. for 90 seconds to give a dried photoresist layer having a thickness of 0.5 μm. After pattern-wise exposure to the ArF excimer laser beams of 193 nm wavelength on an ArF exposure machine (manufactured by Nikon Co.) and a post-exposure baking treatment at 110° C. for 90 seconds, the photoresist layer was subjected to a development treatment by the method of puddle development for 65 seconds at 23° C. in a 2.38% by weight aqueous solution of tetramethylammonium hydroxide followed by rinse in a running stream of water for 30 seconds and drying.

By conducting the pattern-wise exposure for a line-and-space pattern of the line/space width of 0.30 μm, the minimum exposure dose taken as a measure of the photosensitivity of the photoresist composition, which was the exposure dose to give a line-and-space patterned resist layer with a line width to space width ratio of 1:1, was 10.0 mJ/cm².

Further, the cross sectional profile of the line-patterned resist layer was inspected on a scanning electron microscopic photograph for a line-and-space pattern of 0.25 μm line/space width to find excellently orthogonal cross sectional profile standing upright on the substrate surface.

Pattern resolution in the patterned resist layer was excellent to give complete resolution for a line-and-space pattern of 0.20 μm line/space width. No pattern falling could be detected.

Separately, resistance of the photoresist layer against dry etching was tested in an apparatus for dry etching (Model OAPM-406, manufactured by Tokyo Ohka Kogyo Co.) by using tetrafluoromethane as the etching gas to find that the rate of thickness reduction of the resist layer by the dry etching was 105% relative to the rate for a layer of a polyhydroxystyrene resin taken as 100%.

EXAMPLE 2

The procedures for the preparation of the positive-working photoresist solution and evaluation thereof were substantially the same as in Example 1 excepting for the replacement of the copolymer A1 with the same amount of the copolymer A2 obtained in Preparation 3.

The results of the evaluation tests were that: the photosensitivity was 7 mJ/cm$^2$; cross sectional profile of the patterned resist layer of 0.25 μm line width was excellently orthogonal standing upright on the substrate surface; pattern resolution was good for a line-and-space pattern of 0.20 μm line/space width without pattern falling; and the relative rate of film thickness reduction in the dry etching test was 98%.

EXAMPLE 3

The procedures for the preparation of the positive-working photoresist solution and evaluation thereof were substantially the same as in Example 1 excepting for the replacement of the copolymer A1 with the same amount of the copolymer A3 obtained in Preparation 5.

The results of the evaluation tests were that: the photosensitivity was 11.0 mJ/cm$^2$; cross sectional profile of the patterned resist layer of 0.25 μm line width was excellently orthogonal standing upright on the substrate surface; pattern resolution was good for a line-and-space pattern of 0.20 μm line/space width without pattern falling; and the relative rate of film thickness reduction in the dry etching test was 108%.

EXAMPLE 4

The procedures for the preparation of the positive-working photoresist solution and evaluation thereof were substantially the same as in Example 1 excepting for the replacement of the copolymer A1 with the same amount of the copolymer A4 obtained in Preparation 6.

The results of the evaluation tests were that: the photosensitivity was 6 mJ/cm$^2$; cross sectional profile of the patterned resist layer of 0.25 μm line width was excellently orthogonal standing upright on the substrate surface; pattern resolution was good for a line-and-space pattern of 0.20 μm line/space width without pattern falling; and the relative rate of film thickness reduction in the dry etching test was 95%.

EXAMPLE 5

The procedures for the preparation of the positive-working photoresist solution and evaluation thereof were substantially the same as in Example 1 except that the positive-working photoresist solution was prepared by dissolving 100 parts of the copolymer A7 obtained in Preparation 9 described above and 2 parts of triphenylsulfonium trifluoromethane sulfonate in 680 parts of propyleneglycol monomethyl acetate and that the post-exposure baking treatment was conducted at 100° C. instead of 110° C. for 90 seconds.

The results of the evaluation tests were that: the photosensitivity was 10.0 mJ/cm$^2$; cross sectional profile of the patterned resist layer of 0.25 μm line width was excellently orthogonal standing upright on the substrate surface; pattern resolution was good for a line-and-space pattern of 0.18 μm line/space width without pattern falling; and the relative rate of film thickness reduction in the dry etching test was 110%.

EXAMPLE 6

The procedures for the preparation of the positive-working photoresist solution and evaluation thereof were substantially the same as in Example 5 excepting for the replacement of the copolymer A7 with the same amount of the copolymer A8 obtained in Preparation 10.

The results of the evaluation tests were that: the photosensitivity was 12 mJ/cm$^2$; cross sectional profile of the patterned resist layer of 0.25 μm line width was excellently orthogonal standing upright on the substrate surface; pattern resolution was good for a line-and-space pattern of 0.18 μm line/space width without pattern falling; and the relative rate of film thickness reduction in the dry etching test was 110%.

COMPARATIVE EXAMPLE 1

The procedures for the preparation of the positive-working photoresist solution and evaluation thereof were substantially the same as in Example 1 excepting for the replacement of the copolymer A1 with the same amount of the copolymer A5 obtained in Preparation 7.

The results of the evaluation tests were that: the photosensitivity was 8 mJ/cm$^2$; pattern resolution was incomplete for a line-and-space pattern of 0.40 μm line/space width; and the relative rate of film thickness reduction in the dry etching test was 120%.

COMPARATIVE EXAMPLE 2

The procedures for the preparation of the positive-working photoresist solution and evaluation thereof were substantially the same as in Example 1 excepting for the replacement of the copolymer A1 with the same amount of the copolymer A6 obtained in Preparation 8.

The results of the evaluation tests were that: the photosensitivity was 30 mJ/cm$^2$; pattern resolution was incomplete for a line-and-space pattern of 0.35 μm line/space width; and the relative rate of film thickness reduction in the dry etching test was 102%.

What is claimed is:

1. A positive-working photoresist composition in the form of a uniform solution in an organic solvent which comprises:
    (A) 100 parts by weight of an acrylic resin which is subject to a change in the solubility in an aqueous alkaline solution in the presence of an acid; and
    (B) from 0.5 to 30 parts by weight of an acid-generating compound capable of releasing an acid when irradiated with actinic rays,
    the acrylic resin as the component (A) comprising monomeric units represented by the general formula

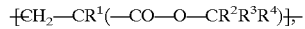

in which $R^1$ is a hydrogen atom or a methyl group, $R^2$ and $R^3$ are each, independently from the other, an alkyl group having 1 to 4 carbon atoms and $R^4$ is an alkoxycarbonyl group or a group derived from a molecule of a lactone compound or ketone compound by removing a hydrogen atom bonded to the carbon atom, the molar fraction of the monomeric units of the general formula given above being from 20% to 80%.

2. The positive-working photoresist composition as claimed in claim 1 in which the acrylic resin as the component (A) further comprises the monomeric units derived from a monomeric compound having a group selected from the group consisting of acid-dissociable cyclic hydrocarbon groups, acid-dissociable oxygen-containing heterocyclic hydrocarbon groups and non-acid-dissociable cyclic hydrocarbon groups.

3. The positive-working photoresist composition as claimed in claim 2 in which the acid-dissociable cyclic hydrocarbon group is 1-methylcyclohexyl group or 1-methyl adamantyl group.

4. The positive-working photoresist composition as claimed in claim 2 in which the acid-dissociable oxygen-containing heterocyclic hydrocarbon group is 2-hydroxy-3-pinanone residue.

5. The positive-working photoresist composition as claimed in claim 2 in which the non-acid-dissociable cyclic hydrocarbon group is selected from the group consisting of cyclohexyl group, adamantyl group, bicyclo[2.2.1]heptyl group and tricyclodecanyl group.

6. The positive-working photoresist composition as claimed in claim 1 in which the acrylic resin as the component (A) further comprises the monomeric units derived from a monomeric compound represented by the general formula

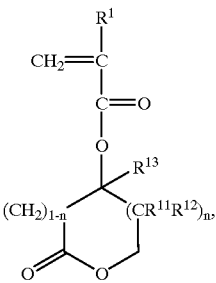

in which $R^1$ is a hydrogen atom or a methyl group, $R^{11}$, $R^{12}$ and $R^{13}$ are each, independently from the others, a hydrogen atom, alkyl group having 1 to 4 carbon atoms or alkoxy group having 1 to 4 carbon atoms and the subscript n is 0 or 1.

7. The positive-working photoresist composition as claimed in claim 1 in which the groups denoted by $R^2$ and $R^3$ are each a methyl group.

8. The positive-working photoresist composition as claimed in claim 1 in which the group denoted by $R^4$ is a residue derived from a lactone compound by removing a hydrogen atom bonded to the carbon atom from a molecule of the lactone compound.

9. The positive-working photoresist composition as claimed in claim 8 in which the lactone compound from which the group denoted by $R^4$ is derived is γ-butyrolactone or a γ-butyrolactone compound substituted by an alkyl group or alkoxy group having 1 to 4 carbon atoms.

10. The positive-working photoresist composition as claimed in claim 1 in which the group denoted by $R^4$ is a residue derived from a ketone compound by removing a hydrogen atom bonded to the carbon atom from a molecule of the ketone compound having 2 to 10 carbon atoms in a molecule.

11. The positive-working photoresist composition as claimed in claim 1 in which the ketone compound from which the group denoted by $R^4$ is derived is acetone.

12. The positive-working photoresist composition as claimed in claim 1 in which the group denoted by $R^4$ is an alkoxycarbonyl group of the formula R—O—CO—, in which R is an alkyl group having 1 to 4 carbon atoms.

13. The positive-working photoresist composition as claimed in claim 1 in which the molar fraction of the monomeric units represented by the general formula is in the range from 40 to 70%.

14. The positive-working photoresist composition as claimed in claim 1 in which the amount of the component (B) is in the range from 1 to 10 parts by weight per 100 parts by weight of the component (A).

* * * * *